United States Patent [19]
Satyanarayan et al.

[11] Patent Number: 5,284,781
[45] Date of Patent: Feb. 8, 1994

[54] METHOD OF FORMING LIGHT EMITTING DIODE BY LPE

[75] Inventors: Arumugam Satyanarayan, Mesa, Ariz.; Bonnie A. Swanson, St. Louis, Mo.; Frank M. Richie, Scottsdale, Ariz.

[73] Assignee: Motorola, Inc., Schaumburg, Ill.

[21] Appl. No.: 54,489

[22] Filed: Apr. 30, 1993

[51] Int. Cl.$^5$ .......................................... H01L 21/265
[52] U.S. Cl. ..................................... 437/23; 437/126; 437/127; 437/130
[58] Field of Search ............... 437/23, 126, 127, 130; 148/DIG. 101; 156/604

[56] References Cited

U.S. PATENT DOCUMENTS

| | | | |
|---|---|---|---|
| 3,755,013 | 8/1973 | Hollau | 437/92 |
| 3,853,643 | 12/1974 | Verleur . | |
| 4,218,269 | 8/1980 | Van Oirschot et al. | 437/133 |
| 4,386,975 | 6/1983 | Leibenzeder et al. | 437/130 |

FOREIGN PATENT DOCUMENTS

| | | | |
|---|---|---|---|
| 0094789 | 7/1981 | Japan | 437/130 |
| 0129482 | 7/1984 | Japan | 437/127 |

OTHER PUBLICATIONS

E. Munoz et al., "Effect of Arsenic Pressure On Heat Treatment Of Liquid Epitaxial GaAs", Applied Physics Letters, vol. 16, No. 7, Apr. 1970, pp. 262-265.

*Primary Examiner*—Olik Chaudhuri
*Assistant Examiner*—Ramamohan Rao Paladugu
*Attorney, Agent, or Firm*—Robert F. Hightower; Joe E. Barbee

[57] ABSTRACT

A liquid phase epitaxial (LPE) melt is formed to be oversaturated with gallium arsenide, and to have a first temperature. A surface of a gallium arsenide substrate is converted to a first P-type layer (12). Subsequently, the first P-type layer (12) and the substrate (11) are covered with the LPE melt. A N-type layer (13) is formed on the first P-type layer (12) by reducing the first temperature of the LPE melt to a second temperature. A second P-type layer (14) is formed on the N-type layer (13) by reducing the second temperature of the LPE melt to a third temperature.

14 Claims, 1 Drawing Sheet

METHOD OF FORMING LIGHT EMITTING DIODE BY LPE

BACKGROUND OF THE INVENTION

The present invention relates, in general, to semiconductor devices, and more particularly, to optical semiconductor devices and fabrication methods for optical semiconductor devices.

Previously, the semiconductor industry has used liquid phase epitaxy (LPE) to produce a variety of different types of optical semiconductor devices including light emitting diodes (LEDs). These prior LEDs generally have a turn-on voltage of approximately 1.0 to 1.5 volts, and a linear voltage-current (V-I) characteristic curve at voltages above the turn-on voltage.

However, many LED applications, such as automotive and industrial applications, need LEDs having high noise immunity. The low turn-on voltage of the prior LEDs is not desirable for such applications.

Additionally, prior liquid phase epitaxial (LPE) fabrication methods do not result in LEDs having the desired high turn-on voltage (greater than approximately 6.0 volts), low operating voltage (less than approximately 6.0 volts), and linear V-I operating characteristics.

Accordingly, it is desirable to have an LED having a high turn-on voltage, a low operating voltage, and a linear V-I operating characteristic; and a liquid phase epitaxial process capable of forming such an LED.

SUMMARY OF THE INVENTION

Briefly stated, the present invention includes creating a liquid phase epitaxial (LPE) melt that is oversaturated with gallium arsenide, and that has a first temperature. A surface of a gallium arsenide substrate is converted to a first P-type layer. Subsequently, the first P-type layer and the substrate are covered with the LPE melt A N-type layer is formed on the first P-type layer by reducing the first temperature of the LPE melt to a second temperature A second P-type layer is formed on the N-type layer by reducing the second temperature of the LPE melt to a third temperature.

DETAILED DESCRIPTION OF THE DRAWINGS

Figure 1:
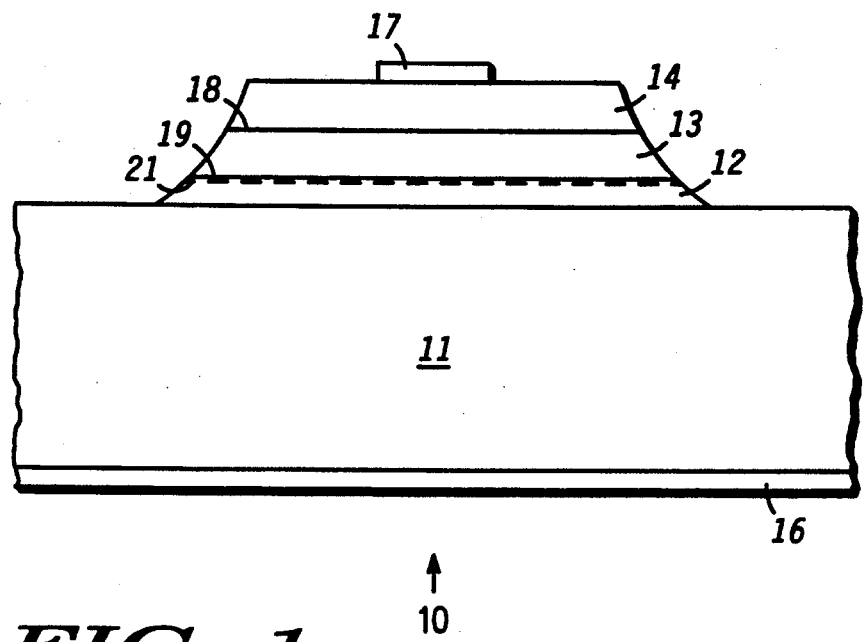
FIG. 1 illustrates an enlarged cross-sectional view of a light emitting diode in accordance with the present invention.

FIG. 1 illustrates an enlarged cross-sectional view of a light emitting diode (LED) 10 that includes a lightly doped N-type gallium arsenide substrate 11. Generally, substrate 11 has an N-type doping concentration of less than approximately $5 \times 10^{17}$ atoms/cm$^3$. In the preferred embodiment, substrate 11 has an N-type doping concentration of approximately $5 \times 10^7$ to $5 \times 10^{15}$ atoms/cm$^3$. LED 10 also includes a first P-type layer 12 that is formed on a first surface of substrate 11, an N-type layer 13, and a second P-type layer 14.

Layers 13 and 14 are formed by covering wafer 11 with a liquid phase epitaxial (LPE) melt that is oversaturated with gallium arsenide. The LPE operations can be accomplished by utilizing an LPE graphite boat that is well known to those skilled in the semiconductor art. One example of such a graphite boat is disclosed in U.S. Pat. No. 3,853,643 issued to Hans W. Verleur on Dec. 10, 1974, which hereby is incorporated herein by reference. The oversaturated LPE melt is created by mixing together a combination of ingredients including gallium, silicon, and gallium arsenide in appropriate amounts that results in the LPE melt that is oversaturated with gallium arsenide. In the preferred embodiment, the by weight combination of ingredients includes approximately 0.87 to 0.884 parts by weight of gallium, approximately 0.001 to 0.003 parts by weight of silicon, and approximately 0.115 to 0.121 parts by weight of gallium arsenide. The combined ingredients are placed in the graphite boat and heated to a first temperature of approximately 900 to 1000 degrees Celsius (° C.) in order to liquefy the ingredients and create the oversaturated LPE melt.

Layer 12 is formed on wafer 11 by converting a portion of the first surface of wafer 11 to first P-type layer 12. The conversion is accomplished by heating wafer 11 to the first temperature in a substantially inert ambient atmosphere. Heating wafer 11 typically is accomplished by placing wafer 11 in a slot or wafer holding recess of the graphite boat prior to heating the combined ingredients. Then, both wafer 11 and the combined ingredients are heated to the first temperature. Wafer 11 is maintained at the first temperature for a sufficient time to form thin P-type layer 12 on wafer 11. In the preferred embodiment, layer 12 is formed by heating wafer 11 to a temperature of approximately 900° to 1000° C. for approximately fifteen to thirty minutes in an argon atmosphere. It is believed, that the high temperature and the inert atmosphere cause arsenic to evolve from the first surface of wafer 11. As the arsenic evolves the remaining gallium creates a thin gallium doped layer of gallium arsenide which is layer 12. In the preferred embodiment, layer 12 has a thickness of approximately five to thirty microns and a P-type doping concentration of approximately $5 \times 10^7$ to $5 \times 10^{17}$ atoms/cm.$^3$. It is also believed that the inert atmosphere causes oxidation of exposed gallium arsenide on the surface of layer 12 thereby forming a thin oxide layer 21 (represented by a dashed line) covering layer 12. Oxide layer 21 generally includes both gallium oxide (GaO) and arsenic oxide (As$_2$O$_3$). It is believed that layer 21 assists in preventing layer 12 from being dissolved during subsequent formation of layers 13 and 14, as will be seen hereinafter. Layer 21 is represented by a dashed line because it is substantially removed during the formation of layers 13 and 14.

In order to form layer 13, wafer 11 and layer 12 are covered with the LPE melt, then the melt and wafer 11 are slowly cooled. During the cooling process, a silicon doped N-type gallium arsenide layer 13 is formed on layer 12. The LPE melt reacts with layer 21, and substantially removes layer 21 before layer 13 is completely formed. The oversaturated condition of the LPE melt substantially prevents the melt from etching layer 12. Without this oversaturated condition, the LPE melt would generally substantially remove layer 12. In addition, it is believed that layer 21 also assists in preventing the LPE melt from reacting with layer 12 by protecting layer 12 from the LPE melt. In the preferred embodiment, layer 13 is formed by cooling the LPE melt to a second temperature of approximately 810° to 850° C. at approximately 0.5° C. per minute. In this preferred embodiment, layer 13 has a thickness of approximately twenty-five to fifty microns and a doping concentration of approximately $1 \times 10^{17}$ to $5 \times 10^{17}$ atoms/cm$^3$. After layer 13 is formed, the LPE melt is further cooled thereby forming P-type gallium arsenide layer 14 on layer 13. In the preferred embodiment, the second temperature is reduced to a third temperature of approximately 740° to 760° C. at a rate of approximately 0.5° C. per minute. This preferred embodiment results in layer 14 having a thickness of approximately twenty-five to one hundred microns and a doping concentration of approximately $1 \times 10^{17}$ to $5 \times 10^{17}$ atoms/cm$^3$.

After completing the formation of layer 14, the melt and wafer 11 are further cooled to a removal temperature which is generally less than 660° C. In the preferred embodiment, the melt and wafer 11 are cooled at a rate of approximately 1.0° C. per minute to reach the removal temperature of approximately 600° to 660° C.

Generally, layers 13, and 14 are subsequently formed into a mesa or other shape that facilitates emitting light from LED 10. In the preferred embodiment, the mesa also includes layer 12 and a portion of substrate 11. An ohmic contact 16 is applied to a second surface of wafer 11 and an ohmic contact 17 is applied to layer 14 to facilitate forming electrical connection to LED 10.

The intersection of layers 13 and 14 creates a P-N junction 18 that facilitates emitting light from LED 10. The intersection of layers 12 and 13 creates an additional P-N junction 19 that modifies the V-I characteristics of LED 10 as explained hereinafter in the discussion of FIG. 2. Junction 19 functions as a forward blocking junction that prevents current flow through LED 10 until the voltage applied to LED 10 exceeds a turn-on voltage $V_t$ (see FIG. 2). After exceeding voltage $V_t$ LED 10 has a linear V-I characteristic similar to prior LEDs.

Figure 2:
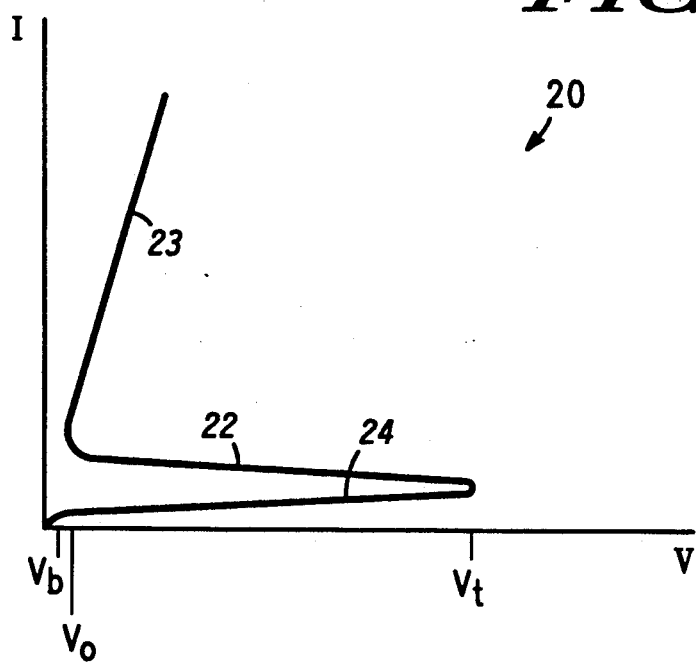
FIG. 2 is a graph illustrating operating characteristics of a light emitting diode in accordance with the present invention.

FIG. 2 is a graph 20 illustrating the V-I characteristics of LED 10 of FIG. 1. The abscissa of graph 20 indicates increasing voltage applied to LED 10 (shown in FIG. 1), while the ordinate indicates current flow through LED 10 (FIG. 1). As voltage is applied to LED 10 (FIG. 1), current flow through LED 10 increases until the voltage reaches a blocking voltage (Vb). As the voltage is increased above the blocking voltage, junction 19 (see FIG. 1) prevents additional current flow until the voltage reaches the turn-on voltage ($V_t$) as shown by section 24 of graph 20. After the turn-on voltage is exceeded, the voltage dropped across LED 10 drops back to an operating voltage ($V_o$) that is substantially equal to or slightly greater than the blocking voltage ($V_b$). Current flow through LED increases linearly for small voltage changes in excess of the operating voltage as shown by a portion 23 of graph 20. In the preferred embodiment, the blocking voltage $V_b$ is approximately 1.0 to 1.5 volts, the turn-on voltage $V_t$ is greater than approximately 6.0 volts, and the operating voltage $V_o$ is greater than approximately 1.5 volts but less than 6.0 volts.

By now it should be appreciated that there has been presented a novel optical semiconductor device and a manufacturing method therefor. Junction 19 provides LED 10 with a high noise immunity by ensuring that small voltage variations do not turn-on LED 10. Yet LED 10 has a low operating voltage and a linear V-I operating curve. The high noise immunity permits LED 10 to be used in high noise environments such as industrial applications, and within automobiles. Forming layer 12 in an inert environment prior to covering wafer 11 with an LPE melt facilitates forming LED 10 with a single melt process that minimizes the cost of LED 10. Using an LPE melt that is oversaturated with gallium arsenide ensures that a first P-type layer remains on the substrate while forming subsequent layers of the device. The inert environment facilitates forming an oxide layer that assists in maintaining the first P-type layer on the substrate.

We claim:

1. A method of forming an optical semiconductor device comprising:
    creating an LPE melt having a first temperature and an oversaturated gallium arsenide concentration wherein the LPE melt is crated in an LPE boat;
    converting a surface of a gallium arsenide substrate to a first P-type layer wherein the converting is performed in the LPE boat prior to covering the gallium arsenide substrate with the LPE melt;
    covering the first P-type layer with the LPE melt;
    forming an N-type layer on the first P-type layer by reducing the first temperature to a second temperature; and
    forming a second P-type layer on the N-type layer by reducing the second temperature to a third temperature.

2. The method of claim 1 wherein creating the LPE melt includes combining at least approximately 0.870 parts by weight of gallium, at least approximately 0.001 parts by weight of silicon, and at least approximately 0.115 parts by weight of gallium arsenide.

3. The method of claim 2 wherein creating the LPE melt having the first temperature includes heating the LPE melt to at least 900 degrees Celsius in an inert atmosphere.

4. The method of claim 1 wherein converting the surface of the gallium arsenide substrate to the first P-type layer includes heating the gallium arsenide substrate to the first temperature in a substantially inert ambient atmosphere.

5. The method of claim 4 wherein converting the surface of the gallium arsenide substrate to the first P-type layer further includes maintaining the gallium arsenide substrate at the first temperature for approximately 15 to 30 minutes.

6. The method of claim 4 wherein converting the surface of the gallium arsenide substrate to the first P-type layer includes forming an oxide layer on the first P-type layer.

7. The method of claim 1 wherein forming the N-type layer on the first P-type layer by reducing the first temperature to the second temperature includes reducing the first temperature to a temperature that is greater than 810 degrees Celsius.

8. The method of claim 7 wherein reducing the first temperature to a temperature that is greater than 810 degrees Celsius includes reducing the first temperature at a rate of approximately 0.5 degrees Celsius/minute.

9. The method of claim 1 wherein forming the second P-type layer on the N-type layer by reducing the second temperature to the third temperature includes reducing the second temperature to a temperature that is greater than approximately 740 degrees Celsius.

10. A method of forming a light emitting diode comprising:
    creating an LPE melt having a first temperature of approximately 900 to 1000 degrees Celsius wherein the LPE melt includes approximately 0.870 to 0.884 parts by weight of gallium, approximately 0.001 to 0.003 parts by weight of silicon, and approximately 0.115 to 0.121 parts by weight of gallium arsenide;

heating a gallium arsenide wafer having a surface to the first temperature in a substantially inert ambient atmosphere;

maintaining the gallium arsenide wafer at the first temperature for approximately 15 to 30 minutes for the purpose of creating a first P-type layer on the first surface of the gallium arsenide wafer;

covering the first P-type layer with the LPE melt;

reducing the first temperature to a second temperature of approximately 810 to 850 degrees Celsius at a first rate of approximately 0.5 degrees Celsius/minute for the purpose of forming an N-type layer on the first P-type layer;

reducing the second temperature to a third temperature of approximately 740 to 760 degrees Celsius at the first rate for the purpose of forming a second P-type layer on the N-type layer; and reducing the third temperature to a fourth temperature between approximately 600 and 660 degrees Celsius at a second rate of approximately 1.0 degree Celsius/minute.

11. The method of claim 10 wherein heating the gallium arsenide wafer includes heating an N-type gallium arsenide wafer having a doping concentration of approximately $1 \times 10^{16}$ to $5 \times 10^{17}$ atoms/cm$^3$.

12. The method of claim 10 wherein the step of maintaining the gallium arsenide wafer at the first temperature includes creating the first P-type layer that has a thickness of approximately 5 to 30 microns and a doping concentration of approximately $5 \times 10^7$ to $5 \times 10^{17}$ atoms/cm$^3$.

13. The method of claim 10 wherein the step of reducing the first temperature to the second temperature includes forming the N-type layer having a thickness of approximately 25 to 50 microns and a doping concentration of approximately $1 \times 10^{17}$ to $5 \times 10^{17}$ atoms/cm$^3$.

14. The method of claim 10 wherein reducing the second temperature to the third temperature includes forming the P-type layer that has a thickness of approximately 25 to 100 microns and a doping concentration of approximately $1 \times 10^{17}$ to $5 \times 10^{17}$ atoms/cm$^3$.

* * * * *